Figure 1:
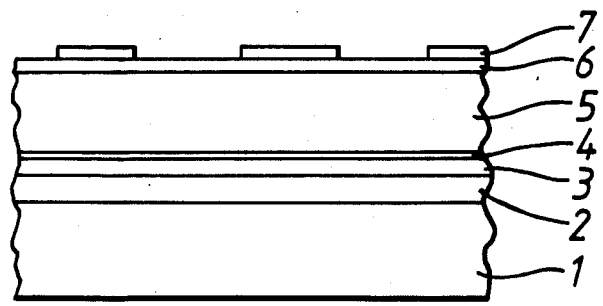

United States Patent [19]

Hockley et al.

[11] Patent Number: 4,665,428
[45] Date of Patent: May 12, 1987

[54] SEMICONDUCTOR DEVICE

[75] Inventors: Peter J. Hockley; Michael J. Thwaites, both of Hook, England

[73] Assignee: The British Petroleum Company p.l.c., London, England

[21] Appl. No.: 895,577

[22] Filed: Aug. 12, 1986

Related U.S. Application Data

[63] Continuation of Ser. No. 689,442, Jan. 7, 1985, abandoned.

[30] Foreign Application Priority Data

Jan. 13, 1984 [GB] United Kingdom ................. 8400959

[51] Int. Cl.⁴ ............................................. H01L 29/12
[52] U.S. Cl. .......................................... 357/58; 357/2; 357/10; 357/12; 357/88
[58] Field of Search .................... 357/2, 10, 12, 58, 88

[56] References Cited

U.S. PATENT DOCUMENTS 4,471,155  9/1984  Mohr et al. ........................... 357/58
4,476,481 10/1984  Iesaka et al. ......................... 357/58

Primary Examiner—Edward J. Wojciechowicz
Attorney, Agent, or Firm—Morgan & Finnegan

[57] ABSTRACT

A semiconductor structure suitable for making a non-volatile memory comprises an electrically conducting substrate, at least two layers of different conductivity type selected from i, p and n-type amorphous or microcrystalline semiconducting material and an additional defect layer of amorphous or microcrystalline semiconductor material located between two of the said different layers. The defect layer reduces the voltage required to transform the structure to a memory device.

10 Claims, 4 Drawing Figures

SEMICONDUCTOR DEVICE

This is a continuation of co-pending application Ser. No. 689,442, filed on Jan. 7, 1985, now abandoned.

This invention relates to a semiconductor of novel structure incorporating amorphous or microcrystalline semiconducting material, to the formation of a memory device from such a structure and to the memory device itself.

IEE Proc., Vol 129, Pt I, Solid State and Electron Devices, No 2, April, 1982, pages 51–54 discloses an electrically programmable non-volatile semiconductor memory device. In its simplest form this contains p and n layers of amorphous silicon deposited onto a conducting stainless steel substrate. The layered structure is conditioned into a memory device by applying a suitably large forward bias which switches the structure into a stable ON state. This step is known as "forming" and permanently modifies the electrical properties of the device. The forming voltage is approximately 20 to 25 volts. After forming the device can then be switched to the alternative OFF state by applying a voltage pulse above a low threshold such as IV with opposite polarity to the original pulse. The OFF state is stable for reverse voltages up to breakdown and forward voltages of approximately 4–5 V. At higher forward bias voltages it switches to the ON state i.e. the forward threshold voltage $V_{ThF}$ is 4–5 V. The ON state is stable for forward voltages up to breakdown and reverse voltages of about 1 volt. At higher reverse bias voltages it switches to the OFF state i.e. the reverse threshold voltage $V_{ThR}$ is about 1 V.

Our copending European patent application No. 0095283 discloses a memory device comprising an electrically conducting substrate and layers of i and p and/or n type amorphous or microcrystalline semi-conducting material which have been conditioned by the application of a voltage sufficiently large to cause the structure to be permanently modified to reduce the electrical resistance of the layers, wherein no p and n layers are adjacent in the device.

Both devices have remarkably fast switching times of less than 100 ns.

U.S. Pat. No. 3,982,262 discloses a semiconductor device containing a region with structural defects. The device is however made from a crystal not from microcrystalline or amorphous material. The device is a electro luminescent display device and the structural defects are provided to quench electroluminesce in defined regions so as to improve contrast. There is no disclosure in any way relevant to amorphous silicon memory devices.

French patent specification FR No. 2 463 508 relates to the provision of an ohmic contact on to a layer of hydrogenated amorphous silicon. A structure is disclosed comprising n-type crystalline silicon with a resistivity of a few ohms/cm, on which a layer of pure amorphous silicon is deposited followed by a layer of hydrogenated amorphous silicon, and then a conducting layer of palladium. The crystalline silicon may be replaced by aluminium or another conductor and the hydrogenated amorphous silicon may be doped. The palladium may be replaced by another metal which can pump hydrogen from the hydrogenated amorphous silicon. The pure amorphous silicon layer will have more defects, giving a higher density of states in the band gap, than the hydrogenated amorphous silicon.

There is no disclosure of a structure having a junction between hydrogenated amorphous silicon (i.e. a dopable material) of two different conductivity types.

It contains nothing which suggests using a layer of semiconductor having increased defects between layers of less defective amorphous semiconductor rather than between a layer of semiconductor and a metal contact in order to given an ohmic contact.

We have now discovered that by incorporating a further layer into amorphous semiconductor memory devices of the junction type described above, the forming voltage can be greatly reduced, without adversely affecting the other properties of the device.

According to the present invention there is provided a semiconductor structure comprising an electrically conducting substrate, at least two layers of different conducting type selected from i, p and n type amorphous or microcrystalline semiconducting material and an additional d layer of amorphous or microcrystalline semiconducting material located between two of the said different layers.

By "d layer" we mean throughout this specification a defect layer i.e. a layer containing more defects than the other layers of semiconducting material and thus having poorer electronic properties than the other semiconducting layers, e.g. having a higher density of states in the band gap between the valence and conduction band.

The amorphous or microcrystalline semiconductor used in the p, i, n and d layers preferably consists essentially of elements of Group IV of the Periodic Table e.g. Si or Ge. Alloys may be used e.g. alloys of silicon and carbon, or silicon and germanium.

The p, n, or i-type amorphous or microcrystalline semiconductor material is a material which can be doped to provide p or n type conductivity (and in the case of p- and n-type material has been doped). For doping to be practicable the density of states in the gap between the valence band and the conduction band must be reduced to relatively low levels. The existence of a high density of states has been attributed to the presence of "dangling bonds". Techniques for reducing the density of states in amorphous and microcrystalline semiconductor material e.g. silicon are well-known. Thus the semiconductor material may be deposited in the presence of hydrogen and/or fluorine or may be treated with hydrogen or fluorine after deposition.

The layers of semiconductor material may be such as to produce homojunctions in which there is a junction between layers of the same material e.g. silicon. The device may also be a heterojunction device e.g. silicon and silicon carbide.

The devices of the present invention are normally two electrode devices in contrast to multielectrode devices such as transistors.

By suitable choice of conditions for the deposition the semiconductor may be deposited in microcrystalline or amorphous form. Conditions favouring the deposition of amorphous semiconductor e.g. amorphous silicon are well-known.

The amorphous or microcrystalline semiconducting material in the i and/or p and/or n layers is preferably silicon or silicon-containing, e.g. an alloy of silicon and carbon.

Layers of i-silicon can be made by methods known in the art, for example by decomposing silane in a glow discharge. Layers of p and p+ or n and n+ silicon can be made by adding diborane or phosphine respectively in varying quantities to the silane. Alloy material can be produced by adding suitable gases (e.g. methane, germane) to the silane in amounts selected to produce the desired alloy.

The silane and other decomposable gas if present can be in admixture with hydrogen and the total pressure controlled to obtain amorphous silicon.

The devices may be grown on a variety of substrates, e.g. transparent conducting oxides on glass, metal on glass, metal sheets.

Desirably the device includes one or more electrically conducting areas on the outer surface of the silicon layer remote from the substrate. These areas can conveniently be provided by zones of a metal such as aluminium or a nickel chromium alloy.

The semiconductor material of the defect layer will have poorer electronic properties than the semiconductor material of the other layers. In the case of amorphous silicon, material suitable for providing the d-layer will typically have a dark conductivity dominated by trapping conduction through intergap states such that its room temperature value is greater than about $10^{-8}$ (ohm cm)$^{-1}$. Its infra red absorption response will typically indicate appreciable densities of $SiH_2$, $(SiH_2)_n$ and $SiH_3$ groupings in the material. The photoconductivity of the undoped material will be appreciably lower than that obtained with the undoped material on which the other layers are based. Thus the photoconductivity of the undoped defective amorphous silicon will be appreciably lower than that of high quality hydrogenated amorphous silicon e.g. lower than about $10^{-6}$ (ohm.cm)$^{-1}$ under AM 1.5 (Air Mass 1.5, a standard illumination condition) illumination.

Material suitable for use in the d-layer will, if fabricated into a p-i-n photovoltaic device, give low power conversion efficiencies e.g. less than 3% for 1 cm$^2$ cells under AM 1.5.

The thickness of the d-layer will in general be too small for the above mentioned properties to be directly measured. However it is possible to test whether given deposition conditions give material suitable for a d-layer by continuing to deposit material over a period of time sufficient to give a thick enough layer of material for the properties of the material to be tested.

The presence of a d-layer may be most readily demonstrated by its effects on the forming voltage. The contribution which the d-layer makes to reducing the forming voltage is influenced by the average thickness of the d-layer. In order to establish whether the conditions intended to generate a d-layer in fact do so it is necessary to deposit a layer of not more than 12 Å (1 nm).

In order to use measurements of forming voltage as an indication of the defectiveness of material deposited under a given set of conditions, it is desirable to restrict the average thickness of the d-layer deposited on the device to be tested to not more than 12 Å, preferably not more than 10 Å. Preferably the material used to form the d-type layer is sufficiently defective that, when the thickness of the d-layer meets the above mentioned conditions, the forming voltage of a device made with the additional layer is less than 60% of the forming voltage of a device made in the same way except for the omission of the layer.

A layer with an increased degree of defects can be produced by various methods and the degree of defectiveness can be assessed from the magnitude of the forming voltage required.

The d-layer may be made by using intrinsically poor material, e.g. an amorphous silicon-germanium alloy, or by growing material under non-ideal conditions, for example, by depositing amorphous silicon in a glow discharge at a substrate temperature less than 150° C. and/or under high pressure and/or high power.

The d layer preferably has an average thickness of 5 to 15 Å (0.5 to 2 nm), more preferably 5–12 Å (0.5 to 1.2 nm) although the layer proper may be discontinuous.

Preferably the total thickness of the structure is less than 5,000 Å (500 nm), more preferably it is in the range 500 to 2,000 Å (50 to 200 nm), e.g. 500 to 1500 Å (50 to 150 nm).

Suitable structures include layers in the configuration p-d-i-n, p-d-i, n-d-i, p-d-n, p+-d-n and p-d-n+.

The device comprising substrate and layers of amorphous or microcrystalline semiconductor is conditioned to a memory device by applying a voltage sufficiently large to cause the device to be capable of being put into a stable state by a voltage of known polarity and reversed by a voltage of opposite polarity.

As stated previously, the presence of the d-layer has the effect of greatly reducing the forming voltage.

This has the advantages of improving the reliability of the forming process and allowing the memory to be integrated with other electronic circuitry prior to the forming step, the latter being an important requirement for the large scale integration of such devices. Additionally when the forming voltage is less than the switching threshold, the application of the appropriate switch polarity is sufficient to form the device, thus eliminating the need for a potentially costly, separate forming stage.

Thus according to another aspect of the present invention there is provided a method for the preparation of a memory device which method comprises subjecting a semiconductor layered structure as hereinbefore described to a forming voltage below 15 volts, preferably below 10 volts, preferably in the range 2–7 volts.

According to yet another aspect there is provided a memory device formed by the application of a voltage below 15 volts to a semiconductor structure comprising an electrically conducting substrate, at least two different layers selected from i, p, and n type amorphous or microcrystalline semiconducting material and an additional d-type layer of amorphous or microcrystalline semiconducting material located between two of the said different layers.

Figure 2:
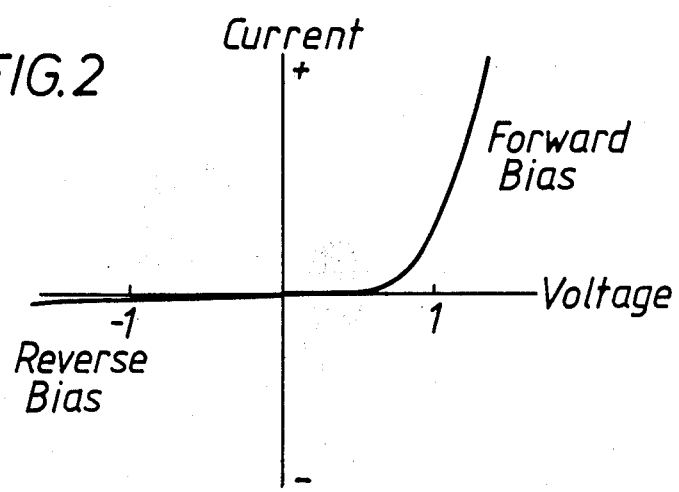
Figure 3:
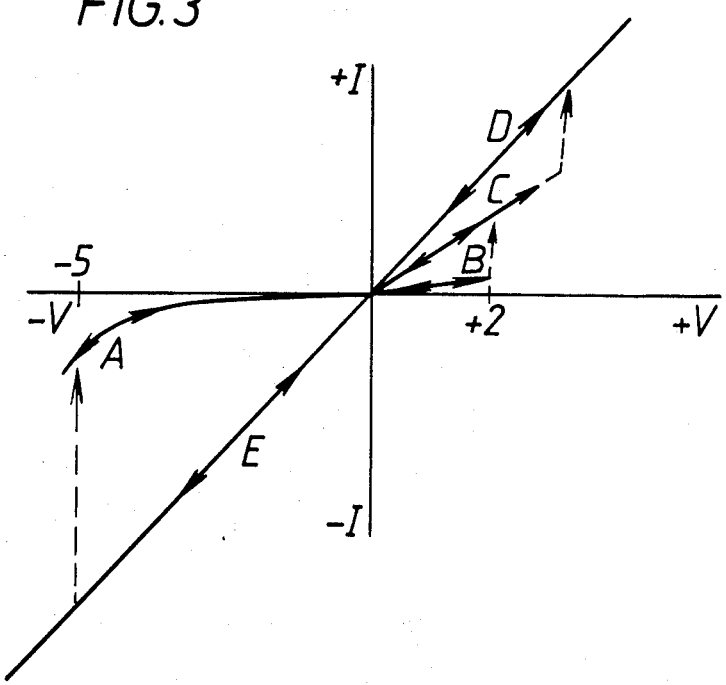
Figure 4:
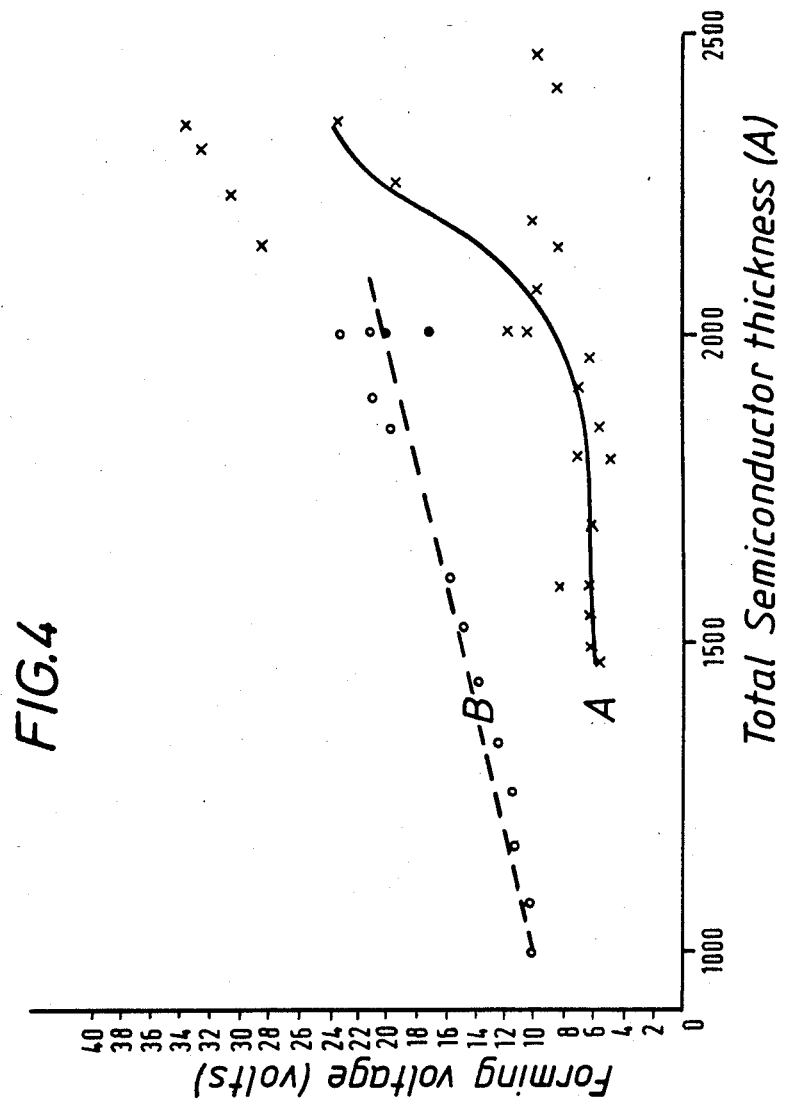

The invention is illustrated with reference to the Examples and FIGS. 1–4 of the accompanying drawings, wherein FIG. 1 is a diagram of a layered structure, FIGS. 2 and 3 depict the voltage/current characteristics of the structure before and after forming, and FIG. 4 is plot of total thickness against forming voltage for a number of structures. cl EXAMPLE 1

An ITO (Indium Tin Oxide) coated glass substrate was placed on a temperature variable substrate holder inside a cylindrical reaction chamber. The chamber was evacuated to $10^{-4}$ torr ($1.3 \times 10^{-2}$ Pa) and the substrate heated to 250° C. Pure silane gas was admitted to the chamber at a controlled continuous flow to bring the pressure to 0.1 torr (13 Pa). Once the system had stabilised a mixture of 1% by volume diborane in hydrogen gas was added to the silane to give a diborane/silane volume ratio of $10^{-3}$. A glow discharge was initiated by exciting a capacitive plate system inside the reaction chamber from a radio frequency generator. This caused p-type amorphous silicon containing boron to be deposited on the ITO coated glass from the gas phase. After two minutes the r.f. power and diborane flow were terminated, and the substrate holder allowed to cool to 100° C. At this temperature a glow discharge was struck in the silane for a period of 7 seconds; this caused a-Si:H of high $SiH_2$, $SiH_3$ content (i.e. a d-layer) to be deposited. The substrate holder was then heated back to 250° C. and the glow discharge restarted to produce an undoped a-Si:H layer. After a period of 10 minutes, 1% by volume phosphine in hydrogen was added to the reaction chamber, to give a phosphine to silane volume ratio of $10^{-3}$, and growth continued for a further 4 minutes. This caused n-type amorphous silicon containing phosphorus to be deposited on top of the i-type material. At this stage the discharge was extinguished, the phosphine flow was stopped and the device was allowed to cool under a flow of silane. When the device had cooled to room temperature it was removed from the reaction chamber and placed in a vacuum coater where several spots of aluminium 1 mm in diameter were evaporated onto the surface of the device.

The complete structure is shown in FIG. 1 wherein 1 represents the glass substrate, 2 the layer of ITO, 3 the layer of p-type silicon, 4 the d-layer, 5 the layer of i-type 6 the layer of n-type and 7 the aluminium spots. The p-layer is about 200 A (20 nm) thick, the n-layer about 300 A (30 nm) and the i-layer about 1000 A (100 nm). The d-layer is estimated to be about 10 A (1 nm) thick on average, though this assumes the d-layer to be continuous and a growth rate equal to that observed for thicker films; in practice, however, the d-layer may be a discontinuous film of very variable thickness.

The device was placed on a curve tracer and its voltage/current characteristics examined. Initially these were of the form shown in FIG. 2. A reverse bias voltage of 2½ volts was then applied to the device; this step "conditioned" the device into a memory (switching) device with characteristics as shown in FIG. 3. The device is forward biased when 2 is more positive than 7.

Curves A and B in FIG. 3 show the device in its OFF state. Applying negative bias (curve A) has no effect on the conductivity state, applying forward bias (curve B) causes the device to switch to an intermediate conductivity state (curve C) at about 2 V. Further forward bias finally switches the device to its ON state, (curve D). Higher forward voltages have no further effect on the conductivity state for all values below that inducing breakdown by conventional means e.g. avalanche breakdown. Applying negative bias now leaves the device in the ON state (curve E) until a potential of 5 V is attained, whereupon it immediately switches to its OFF state (curve A). This sequence of events is repeatable with no change in the ON-OFF conductivity or switching levels.

The ON conductivity of the device was about 160 ohms, the OFF conductivity in excess of 500 K ohms, giving an ON-OFF ratio in excess of 3000.

By comparison, devices of the same thickness grown in the same manner without a d-layer have considerably higher forming voltages and ON-OFF ratios of only 30-100 as a result of a much higher conductivity OFF state. Additionally, the higher forming voltage often results in immediate destruction of the memory, thus successful forming is achieved on only 10% of devices, compared with almost 100% for structures including a d-layer.

EXAMPLE 2

A device was prepared in a similar manner to Example 1, excepting that the ITO coated glass was deliberately placed in a region where non-uniform growth rates occurred due to plasma non-uniformity. This produced material with a range of thicknesses in all layers, onto which a pattern of aluminium dots was evaporated to give a series of devices of varying thickness.

Each device was then conditioned to a memory state, note being made of the forming voltage in each case. The results of this experiment are shown in FIG. 4 marked by crosses and clearly show a thickness dependence on the forming voltage. Curve A represents the best fit to the observed points.

COMPARATIVE TEST A

In a Comparative Test not according to the invention devices were made and tested as in Example 2 except that the step of depositing a d-layer was omitted. The results are shown in FIG. 2 marked by circles. Curve B represents a best fit to these points by curve B.

It is believed that the increase in forming voltage found with thicker devices having a d-layer is not related to the thickness of the device but to the thickness of the d-layer. In the thicker devices tested all the layers were of increased thickness. It is believed that the average thickness of the d-layer in devices of thickness greater than 2000 A (200 nm) greater than about 13 A (1.3 nm). Reduction in forming voltage can be obtained with thicker devices than those exemplified above providing that the d-layer thickness is not excessive.

We claim:

1. In a non-volatile memory device comprising at least two layers of different conductivity type selected from i-, p- and n-type amorphous or micro-crystalline semi-conductor and which exhibitsd across said layers at least two stable conductance state of high and low conductance respectively at an applied voltage between given positive threshold voltages and which is repeatedly switchable between said conductance states by applied voltage of opposite polarity which device is produced by applying a forming voltage to a layered structure which does not have non-voltatide memory properties the improvement which comprises providing an additional d-type layer of amorphous or micro-crystalline semi-conductor located between two or said different layers and in contact with two of said layers, said d-type layer having an average thickness not exceeding 12 Angstroms, and having pooere electronic properties than the other semi-conducting layers such that it has a substantially smaller increase in conductivity on illumination under standard AM 1.5 conditions than the material of any other layer of the same semi-conductor forming part of the p-, n-or i-layers of the device, and such that the forming voltage of the device is not more than 60% of the forming voltage of an otherwise identical device without the d-layer.

2. A device according to claim 1 wherein the semi-conductor material consists essentially of elements of Group IV of the Periodic Table.

3. A device according to claim 2 wherein the semi-conductor material is silicon.

4. A device according to claim 3 wherein the increase in conductivity of the material of the d-layer is substantially less than $10^{-6}$ $(ohm)^{-1}$ under standard AM 1.5 illumination.

5. A device according to claim 4 wherein the d-layer is of material having a room temperature dark conductivity greater than about $10^{-8}$ $(ohm)^{-1}$.

6. A device according to claim 1 wherein the total thickness of the structure across which the forming voltage is applied is less than 5000 Angstrom.

7. A device according to claim 6 wherein the total thickness of the structure across which a forming voltage is applied is less than 2000 Angstroms.

8. A device according to claim 3 wherein the p-, n-, and i-, layers are produced by depositing amorphous silicon using a glow discharge at a substrate temperature of more than 150° C. and the d-layer is made by depositing amorphous silicon using a glow discharge with a substrate temperature of less than 150° C.

9. A device according to claim 1 made by subjecting (1) a structure comprising an electrically conducting substrate, at least two layers of different conductivity types selected from i, p and n-type amorphous or micro-crystalline semi-conducting material and an additional d-type layer of amorphous or micro-crystalline semi-conducting material located between two of the said different layers to (2) a forming voltage below 15 volts.

10. A memory device according to claim 9 wherein the forming voltage is below 10 volts.

* * * * *